(12) United States Patent
Gui et al.

(10) Patent No.: US 10,656,478 B2
(45) Date of Patent: May 19, 2020

(54) ARRAY SUBSTRATE AND MANUFACTURING METHOD THEREOF, AND DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventors: Bingqiang Gui, Beijing (CN); Lianjie Qu, Beijing (CN); Yonglian Qi, Beijing (CN); Hebin Zhao, Beijing (CN); Yun Qiu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/777,829

(22) PCT Filed: Oct. 9, 2017

(86) PCT No.: PCT/CN2017/105382
§ 371 (c)(1),
(2) Date: May 21, 2018

(87) PCT Pub. No.: WO2018/166190
PCT Pub. Date: Sep. 20, 2018

(65) Prior Publication Data
US 2019/0227393 A1     Jul. 25, 2019

(30) Foreign Application Priority Data

Mar. 14, 2017  (CN) .......................... 2017 1 0149453

(51) Int. Cl.
*H01L 27/12*     (2006.01)
*G02F 1/1343*   (2006.01)
(Continued)

(52) U.S. Cl.
CPC ...... *G02F 1/134363* (2013.01); *G02F 1/1368* (2013.01); *G02F 1/13439* (2013.01);
(Continued)

(58) Field of Classification Search
CPC ............... H01L 27/124; H01L 27/1248; H01L 27/1259; H01L 27/1288
See application file for complete search history.

(56) References Cited

U.S. PATENT DOCUMENTS

2013/0248870 A1    9/2013  Jung et al.
2015/0235585 A1*   8/2015  Kim ........................ G09G 3/18
                                                                    345/103
(Continued)

FOREIGN PATENT DOCUMENTS

CN        103915443 A      7/2014
CN        103985715 A      8/2014
(Continued)

OTHER PUBLICATIONS

Notification of the First Office Action issued in Chinese Patent Application No. 201710149453.4, dated Mar. 21, 2019; with English translation.
(Continued)

*Primary Examiner* — Matthew L Reames
(74) *Attorney, Agent, or Firm* — McDermott Will & Emery LLP

(57) ABSTRACT

An array substrate and a manufacturing method thereof, and display panel are disclosed. The array substrate includes a substrate, a thin film transistor disposed on the substrate and a common electrode disposed on a side of the thin film transistor away from the substrate. The common electrode includes a first hollowed-out portion. An active layer of the thin film transistor includes a source electrode region, a drain electrode region and a channel region. An orthographic (Continued)

projection of the first hollowed-out portion on the substrate at least covers an orthographic projection of the channel region on the substrate.

13 Claims, 8 Drawing Sheets

(51) Int. Cl.
    *G02F 1/1362*     (2006.01)
    *G03F 7/16*     (2006.01)
    *G03F 7/20*     (2006.01)
    *G03F 7/26*     (2006.01)
    *G02F 1/1368*     (2006.01)
    *G02F 1/136*     (2006.01)

(52) U.S. Cl.
    CPC .......... *G02F 1/136227* (2013.01); *G03F 7/16* (2013.01); *G03F 7/20* (2013.01); *G03F 7/26* (2013.01); *H01L 27/124* (2013.01); *H01L 27/1248* (2013.01); *H01L 27/1259* (2013.01); *H01L 27/1288* (2013.01); *G02F 2001/13606* (2013.01); *G02F 2001/136236* (2013.01); *G02F 2201/121* (2013.01)

(56) References Cited

U.S. PATENT DOCUMENTS

2016/0246148 A1     8/2016   Li et al.
2017/0160597 A1     6/2017   Ye

FOREIGN PATENT DOCUMENTS

| CN | 203826391 U | 9/2014 |
|---|---|---|
| CN | 105068339 A | 11/2015 |
| CN | 106935597 A | 7/2017 |

OTHER PUBLICATIONS

International Search Report and Written Opinion issued in International Patent Application No. PCT/CN2017/105382, dated Jan. 8, 2018; with English translation.

\* cited by examiner

ARRAY SUBSTRATE AND MANUFACTURING METHOD THEREOF, AND DISPLAY PANEL

This application is the U.S. National Phase under 35 U.S.C. § 371 of International Patent Application No. PCT/CN2017/105382, filed on Oct. 9, 2017, which in turn claims priority to Chinese Patent Application No. 201710149453.4, filed on Mar. 14, 2017, titled "ARRAY SUBSTRATE AND MANUFACTURING METHOD THEREOF, AND DISPLAY PANEL", the entire disclosures of which Applications are incorporated by reference herein.

TECHNICAL FIELD

The present disclosure relates to the display technology field, and more particularly, to an array substrate and a manufacturing method thereof, and a display panel.

BACKGROUND

In recent years, with the continuous development of various display technologies, such as LCD (Liquid Crystal Display) display technology, Organic Light-Emitting Diode (OLED) display technology, flexible display technology and transparent display technology, display panels with large-size and high-resolution products emerge in endlessly.

SUMMARY

Embodiments of the present disclosure adopt the following technical solutions.

According to a first aspect, an array substrate is provided. The array substrate comprises: a substrate, a thin film transistor disposed on the substrate and a common electrode including a first hollowed-out portion and disposed on a side of the thin film transistor away from the substrate. An active layer of the thin film transistor includes a source electrode region, a drain electrode region and a channel region. An orthographic projection of the first hollowed-out portion on the substrate at least covers an orthographic projection of the channel region on the substrate.

Optionally, the orthographic projection of the first hollowed-out portion on the substrate covers an orthographic projection of the active layer on the substrate.

Optionally, the orthographic projection of the first hollowed-out portion on the substrate covers orthographic projections of the active layer and a source electrode of the thin film transistor on the substrate.

Optionally, the array substrate further includes an insulating layer disposed between the thin film transistor and the common electrode, and a passivation layer and a pixel electrode which are sequentially disposed on a side of the common electrode away from the substrate. The insulating layer includes a first via hole. The passivation layer includes a second via hole and a second hollowed-out portion. An orthographic projection of the pixel electrode on the substrate does not overlap with the orthographic projection of the first hollowed-out portion on the substrate. The common electrode further includes a third via hole. The orthographic projection of the first hollowed-out portion on the substrate overlaps with an orthographic projection of the second hollowed-out portion on the substrate. An orthographic projection of the first via hole on the substrate, an orthographic projection of the second via hole on the substrate and an orthographic projection of the third via hole on the substrate are overlapped with each other. A size of the third via hole is greater than or equal to a size of the first via hole, and the size of the third via hole is greater than a size of the second via hole. The pixel electrode is electrically connected to a drain electrode of the thin film transistor through the first via hole, the second via hole and the third via hole.

According to a second aspect, a display panel is provided. The display panel includes an array substrate according to the first aspect.

According to a third aspect, a manufacturing method of the array substrate is provided. The manufacturing method of the array substrate includes: forming a thin film transistor on a substrate by using a patterning process; forming an insulating layer, a common electrode, a passivation layer and a pixel electrode which are sequentially disposed on a side of the thin film transistor away from the substrate by using the patterning process for three times, on the substrate on which the thin film transistor has been formed. The insulating layer includes a first via hole. The common electrode includes a third via hole and a first hollowed-out portion. The passivation layer includes a second via hole and a second hollowed-out portion. An orthographic projection of the pixel electrode on the substrate does not overlap with an orthographic projection of the first hollowed-out portion on the substrate. The active layer of the thin film transistor includes a source electrode region, a drain electrode region and a channel region. The orthographic projection of the first hollowed-out portion on the substrate at least covers an orthographic projection of the channel region on the substrate, the orthographic projection of the first hollowed-out portion on the substrate overlaps with an orthographic projection of the second hollowed-out portion on the substrate. An orthographic projection of the first via hole on the substrate, an orthographic projection of the second via hole on the substrate, and an orthographic projection of the third via hole on the substrate are overlapped with each other. A size of the third via hole is greater than or equal to a size of the first via hole, and the size of the third via hole is greater than a size of the second via hole. The pixel electrode is electrically connected to a drain electrode of the thin film transistor through the first via hole, the second via hole and the third via hole.

Optionally, the forming the insulating layer, the common electrode, the passivation layer and the pixel electrode which are sequentially disposed on the side of the thin film transistor away from the substrate by using the patterning process for three times specifically includes: forming the insulating film layer on the substrate on which the thin film transistor has been formed; forming a common electrode film layer including the third via hole by using the patterning process for one time on the substrate on which the insulating film layer has been formed; etching a part of the insulating film layer located right below the third via hole by using a dry etching to form the insulating layer including the first via hole; forming the passivation layer including the second via hole and the second hollowed-out portion by using the patterning process for one time on the substrate on which the insulating layer and the common electrode film layer have been formed; forming the pixel electrode of which the orthographic projection on the substrate does not overlap with the orthogonal projection of the first hollowed-out portion on the substrate by using the patterning process for one time on the substrate on which the passivation layer has been formed, and forming the first hollowed-out portion on the common electrode film layer, thereby forming the common electrode including the third via hole and the first hollowed-out portion.

Optionally, the forming the pixel electrode of which the orthographic projection on the substrate does not overlap with the orthogonal projection of the first hollowed-out portion on the substrate by using the patterning process for one time on the substrate on which the passivation layer has been formed, and forming the first hollowed-out portion in the common electrode film layer, thereby forming the common electrode including the third via hole and the first hollowed-out portion specifically includes: forming a transparent conductive film on the substrate on which the passivation layer has been formed, and forming a photoresist; exposing the photoresist by using a mask, and developing to form a photoresist completely-remained portion and a photoresist completely-removed portion; wherein, the photoresist completely-removed portion at least corresponds to the first hollowed-out portion which is to be formed, and a size of the photoresist completely-removed portion corresponding to the first hollowed-out portion which is to be formed is greater than a size of the first hollowed-out portion which is to be formed; etching the transparent conductive film and performing an over-etched process on the common electrode film layer to form the pixel electrode of which the orthographic projection on the substrate does not overlap with the orthographic projection of the first hollowed-out portion on the substrate, and to form the first hollowed-out portion in the common electrode film layer, thereby forming the common electrode including the third via hole and the first hollowed-out portion; removing a part of the photoresist corresponding to the photoresist completely-remained portion by using a lift-off process.

Optionally, the forming the insulating layer, the common electrode, the passivation layer and the pixel electrode which are sequentially disposed on the side of the thin film transistor away from the substrate by using the patterning process for three times specifically includes: forming the insulating film layer on the substrate on which the thin film transistor has been formed; forming a common electrode film layer including the third via hole by using the patterning process for one time on the substrate on which the insulating film layer has been formed; etching a part of the insulating layer located right below the third via hole by using a dry etching to form the insulating film layer including the first via hole; forming the passivation layer including the second via hole and the second hollowed-out portion by using the patterning process for one time on the substrate on which the insulating layer and the common electrode film layer have been formed; etching a part of the common electrode film layer located right below the second hollowed-out portion is by using a wet etching to form the first hollowed-out portion in the common electrode film layer, thereby forming the common electrode including the third via hole and the first hollowed-out portion; and forming the pixel electrode of which the orthographic projection on the substrate does not overlap with the orthographic projection of the first hollowed-out portion on the substrate by using the patterning process for one time on the substrate on which the passivation layer has been formed.

Based on the above, optionally, the forming the thin film transistor on the substrate by using the patterning process includes: forming a gate metal layer including a gate electrode on the substrate by using the patterning process for one time and forming a gate passivation layer; and forming an active layer and a source drain metal layer which includes a source electrode and a drain electrode by using the patterning process for one time on the substrate on which the gate passivation layer has been formed.

BRIEF DESCRIPTION OF THE DRAWINGS

In order to describe technical solutions in embodiments of the present disclosure or in the prior art more clearly, the drawings to be used in the description of embodiments or the prior art will be introduced briefly. Obviously, the drawings to be described below are merely some embodiments of the present disclosure, and a person of ordinary skill in the art can obtain other drawings according to those drawings without paying any creative effort.

DETAILED DESCRIPTION

The technical solutions in embodiments of the present disclosure will be described clearly and completely with reference to the drawings in the embodiments of the present disclosure. Obviously, the embodiments described are merely some but not all of embodiments of the present disclosure. All other embodiments made on basis of the embodiments of the present disclosure by a person of ordinary skill in the art without paying any creative effort shall be included in the protection scope of the present disclosure.

Unless defined otherwise, technical terms or scientific terms used herein should be commonly understood by those skilled in the art. Terms "first", "second" and other similar terms used in the description and claims of the present disclosure do not denote any order, quantity or importance, but merely distinguish between different components. Similarly, "a", "an" or "the" does not mean a limitation of quantity but means that at least one exists. Terms "include" or "comprise" other similar terms mean that an element or an article that appear before the term covers elements or items that appear after the term and their equivalents, but do not exclude other elements or items.

Figure 1:
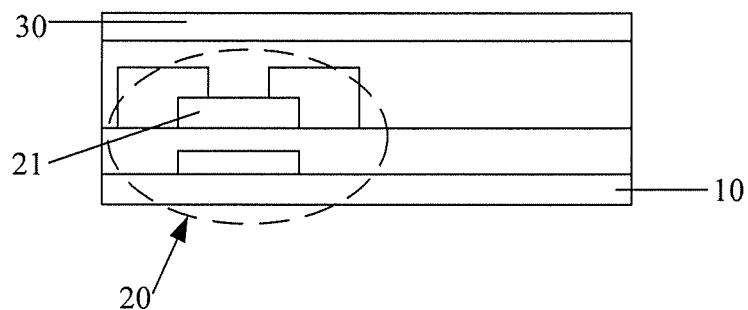
FIG. 1 is a structural schematic diagram of an array substrate.

FIG. 1 shows an array substrate. The array substrate includes a thin film transistor 20 disposed on a substrate 10 and a common electrode 30. Since an orthographic projection of the common electrode 30 on the substrate 10 covers an orthographic projection of an active layer 21 of the thin film transistor 20 on the substrate 10, a mobility of an electron of the active layer 21 is affected and a stability of a threshold voltage of the thin film transistor 20 is deteriorated, thereby affects the performance of the thin film transistor 20.

In order to reduce a parasitic capacitance between a transparent conductive layer and the active layer, some embodiments of the present disclosure provide an array substrate and a manufacturing method thereof, and a display panel. In the embodiments of the present disclosure, a first hollowed-out portion is disposed on the common electrode, and an orthographic projection of the first hollowed-out portion on the substrate at least covers a channel region of the active layer. In this way, a position above the channel region and also corresponding to the channel region is not covered by the common electrode, thereby the influence of the common electrode on the mobility of the electron of the channel region of the active layer is reduced, and the stability of the threshold voltage of the thin film transistor is improved. Also, the parasitic capacitance between the common electrode and the channel region is avoided, thereby the performance of the thin film transistor can be improved.

Figure 2:
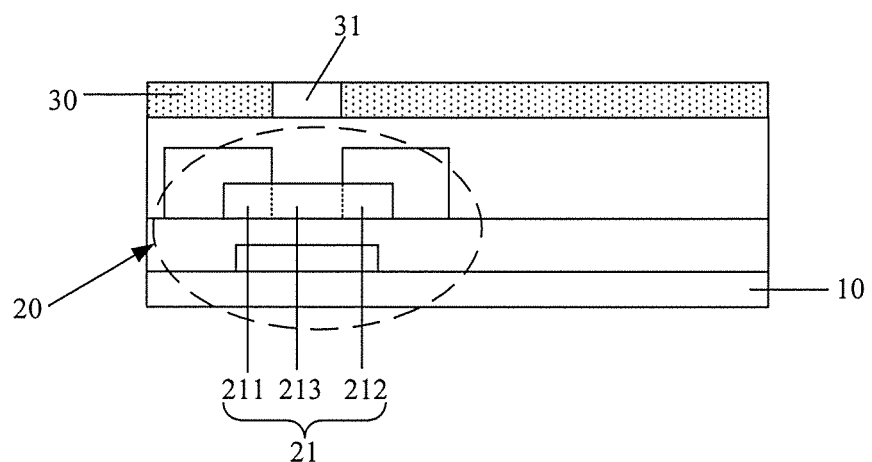
FIG. 2 is a first structural schematic diagram of an array substrate provided in some embodiments of the present disclosure.

Some embodiments of the present disclosure provide an array substrate. As shown in FIG. 2, the array substrate includes a substrate 10, a thin film transistor 20 disposed on the substrate 10, and a common electrode 30 disposed on a side of the thin film transistor 20 away from the substrate 10. The common electrode 30 includes a first hollowed-out portion 31. The thin film transistor 20 includes an active layer 21. The active layer 21 includes a source electrode region 211, a drain electrode region 212 and a channel region 213. An orthographic projection of the first hollowed-out portion 31 on the substrate 10 covers at least an orthographic projection of the channel region 213 on the substrate 10.

It should be noted that, firstly, the thin film transistor 20 includes a gate, a gate insulating layer, a semiconductor active layer, a source electrode and a drain electrode.

The thin film transistor 20 may be an amorphous silicon thin film transistor, a polycrystalline silicon thin film transistor, a metal oxide thin film transistor, an organic thin film transistor or the like depending on a material of the semiconductor active layer. Based on this, the thin film transistor 20 may be a staggered type thin film transistor, an inverted staggered type thin film transistor, a coplanar type thin film transistor, an anti-coplanar type thin film transistor or the like.

Secondly, a region of the active layer 21 corresponding to the source electrode is the source electrode region 211. A region of the active layer 21 corresponding to the drain electrode is the drain electrode region 212.

Thirdly, the orthographic projection of the first hollowed-out portion 31 on the substrate 10 covers at least the orthographic projection of the channel region 213 on the substrate 10, that is, as shown in FIG. 2, there is no overlap portion between an orthographic projection of the common electrode 30 on the substrate 10 and the orthographic projection of the channel region 213 on the substrate 10 at least.

Here, cover means that the orthographic projection of the first hollowed-out portion 31 on the substrate 10 is greater than or equal to the orthographic projection of the channel region 213 on the substrate 10.

The embodiments of the present disclosure provide an array substrate. In the embodiments of the present disclosure, the first hollowed-out portion 31 is disposed on the common electrode 30 and the orthographic projection of the first hollowed-out portion 31 on the substrate 10 at least covers the channel region 213 of the active layer 21. In this way, the position above the channel region 213 and also corresponding to the channel region 213 is not covered by the common electrode 30, thereby the influence of the common electrode 30 on the mobility of the electron of the channel region 213 of the active layer 21 is reduced, and the stability of the threshold voltage of the thin film transistor 20 is improved. Also, the parasitic capacitance between the common electrode 30 and the channel region 213 is avoided, thereby the performance of the thin film transistor 20 can be improved.

Figure 3:
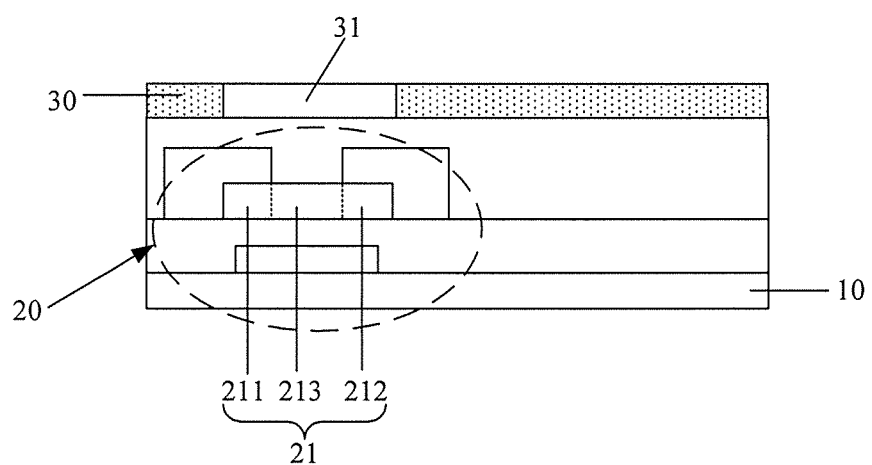
FIG. 3 is a second structural schematic diagram of an array substrate provided in some embodiments of the present disclosure.

Optionally, as shown in FIG. 3, the orthographic projection of the first hollowed-out portion 31 on the substrate 10 covers an orthographic projection of the active layer 21 on the substrate 10.

In the embodiments of the present disclosure, by making the orthographic projection of the first hollowed-out portion 31 on the substrate 10 covers the orthographic projection of the active layer 20 on the substrate 10, there is no overlap portion between the orthographic projection of the common electrode 30 on the substrate 10 and the orthographic projection of the active layer 21 on the substrate 10, thereby the influence of the common electrode 30 on the mobility of the electron of the active layer 21 is reduced, thus a parasitic capacitance between the common electrode 30 and the source electrode of the source electrode region 211 and a parasitic capacitance between the common electrode 30 and the drain electrode of the drain electrode region 212 are avoided.

Figure 4:
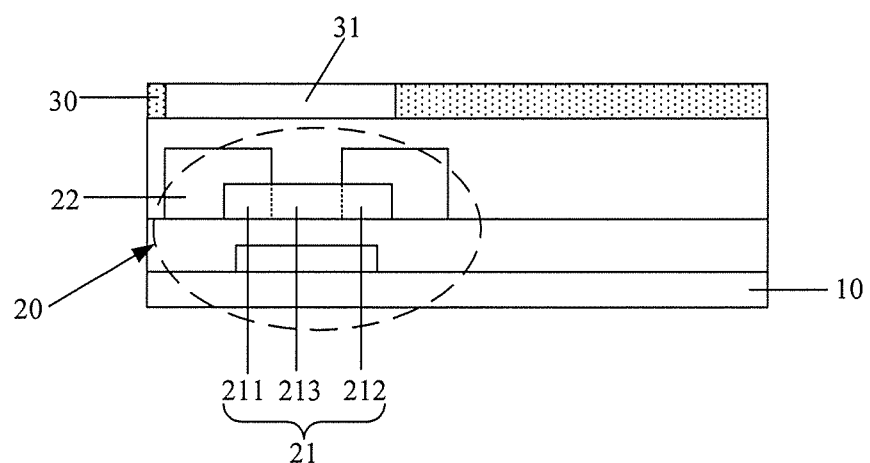
FIG. 4 is a third structural schematic diagram of an array substrate provided in some embodiments of the present disclosure.

Optionally, as shown in FIG. 4, the orthographic projection of the first hollowed-out portion 31 on the substrate 10 covers an orthographic projection of the active layer 21 and the source electrode 22 of the thin film transistor 20 on the substrate 10.

In the embodiments of the present disclosure, by making the orthographic projection of the first hollowed-out portion 31 on the substrate 10 covers the orthographic projection of the active layer 21 and the source electrode 22 of the thin film transistor 20 on the substrate 10, not only the parasitic capacitance between the common electrode 30 and the channel region 213 of the active layer 20 can be eliminated, but also the parasitic capacitance between the common electrode 30 and the active layer 21 and the parasitic capacitance between the common electrode 30 and the source electrode 22 can be eliminated, thereby the performance of the thin film transistor is further improved.

Figure 5:
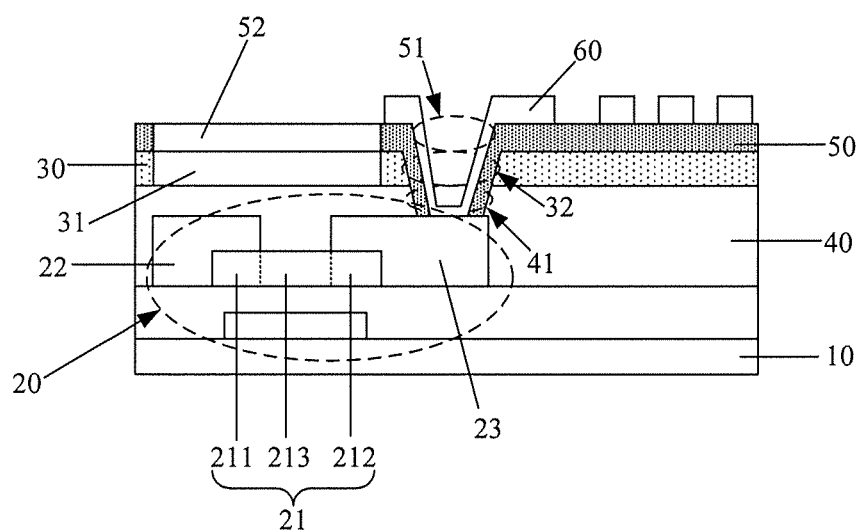
FIG. 5 is a fourth structural schematic diagram of an array substrate provided in some embodiments of the present disclosure.

Optionally, as shown in FIG. 5, the array substrate further includes an insulating layer 40 disposed between the thin film transistor 20 and the common electrode 30, and a passivation layer 50 and a pixel electrode 60 sequentially disposed on a side of the common electrode 30 away from the substrate 10 respectively. The insulating layer 40 includes a first via hole 41. The passivation layer 50 includes a second via hole 51 and a second hollowed-out portion 52. An orthographic projection of the pixel electrode 60 on the substrate 10 does not overlap with the orthographic projection of the first hollowed-out portion 31 on the substrate 10. The common electrode 30 further includes a third via hole

32. The orthographic projection of the first hollowed-out portion 31 on the substrate 10 overlaps with an orthographic projection of the second hollowed-out portion 52 on the substrate 10. An orthographic projection of the first via hole 41 on the substrate 10, an orthographic projection of the second via hole 51 on the substrate 10 and an orthographic projection of the third via hole 32 on the substrate 10 are overlapped with each other. A size of the third via hole 32 is greater than or equal to a size of the first via hole 41, and the size of the third via hole 32 is larger than a size of the second via hole 51. The pixel electrode 60 is electrically connected to the drain electrode 23 of the thin film transistor 20 through the first via hole 41, the second via hole 51 and the third via hole 32.

The orthographic projection of the first hollowed-out portion 31 on the substrate 10 can be overlapped with the orthographic projection of the second hollowed-out portion 52 on the substrate 10, and the orthographic projection of the second hollowed-out portion 52 on the substrate 10 may fall into the orthographic projection of the first hollowed-out portion 31 on the substrate 10. It is also possible that, the orthographic projection of the first hollowed-out portion 31 on the substrate 10 falls into the orthographic projection of the second hollowed-out portion 52 on the substrate 10. However, in these three cases, there is no overlap portion between the orthographic projection of the pixel electrode 60 on the substrate 10 and the orthographic projection of the first hollowed-out portion 31 on the substrate 10, in other words, there is no pixel electrode 60 at a position corresponding to the first hollowed-out portion 31.

In addition, those skilled in the art should understand that, the pixel electrode 60 is electrically connected to the drain electrode 23 of the thin film transistor 20 through the first via hole 41, the second via hole 51 and the third via hole 32, so the orthographic projection of the first via hole 41 on the substrate 10, the second via hole 51 on the substrate 10 and the orthographic projection of the third via hole 32 on the substrate 10 all inevitably fall into the orthographic projection of the drain electrode 23 on the substrate 10.

Moreover, as shown in FIG. 5, the size of the third via hole 32 should be greater than or equal to the size of the first via hole 41 to prevent the common electrode 30 from being electrically connected to the drain electrode 23. The size of the third via hole 32 should be greater than the size of the second via hole 51 to prevent the common electrode 30 from being electrically connected to the pixel electrode 60, thereby, the pixel electrode 60 and the common electrode 30 are separated by the passivation layers 50 when the pixel electrode 60 and the drain electrode 23 are electrically connected.

In addition, the common electrode 30 and the pixel electrode 60 are both disposed on the array substrate, and the common electrode 30 is tiled in a single layer. The pixel electrode 60 is comb-shaped at the top.

Figure 11:
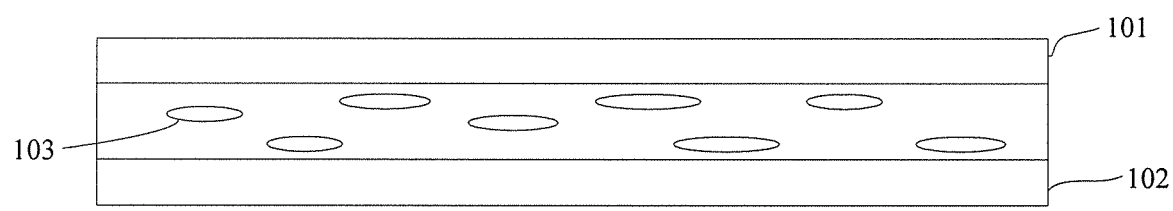
FIG. 11 is a cross-sectional structural schematic diagram of a display panel provided in some embodiments of the present disclosure.

Some embodiments of the present disclosure further provide a display panel 100. As shown in FIG. 11, the display panel 100 includes the above mentioned array substrate 101.

When the display panel is a liquid crystal display (LCD), as shown in FIG. 11, the display panel includes the array substrate 101 described above, an assembling substrate 102 and a liquid crystal layer 103 disposed therebetween. The assembling substrate may include a black matrix. The liquid crystal display panel may further include a color film. The color film may be disposed on the assembling substrate or on the array substrate.

The display panel provided in the embodiments of the present disclosure includes any one of the array substrates described above. The beneficial effects of the display panel are the same as the beneficial effects of the array substrate, which are not described herein again.

Figure 6:
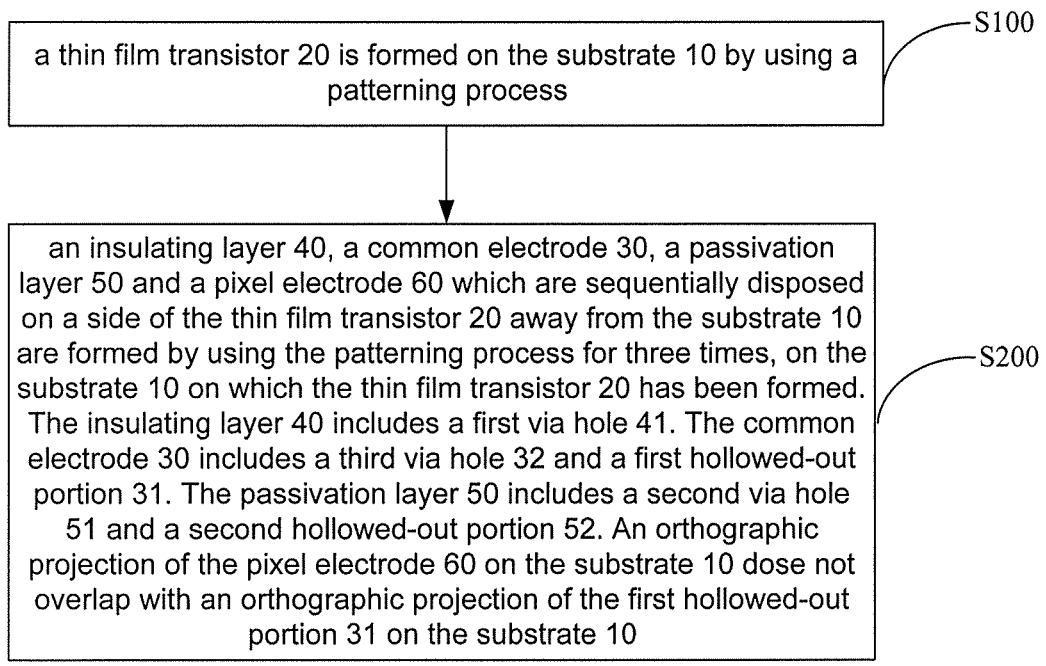
FIG. 6 is a first schematic flow chart of a manufacturing method of an array substrate provided in some embodiments of the present disclosure.

Some embodiments of the present disclosure further provide a manufacturing method of an array substrate. As shown in FIG. 6, the manufacturing method includes the following steps (S100~S200).

S100, a thin film transistor 20 is formed on the substrate 10 by using a patterning process.

The thin film transistor 20 includes a gate, a gate insulating layer, a semiconductor active layer, a source electrode and a drain electrode. A gate line electrically connected to the gate, a gate lead line located at a peripheral region of the array substrate and the like may be formed simultaneously with the formation of the gate. A data line electrically connected to the source electrode, a data lead line located the peripheral region of the array substrate and the like may be formed simultaneously with the formation of the source electrode and the drain electrode.

Here, the manufacturing process of the thin film transistor 20 is not limited. During the manufacturing process, for example, steps of forming the semiconductor active layer and a source drain metal layer including the source electrode and the drain electrode may be implement by using the patterning process for twice. The steps of forming the semiconductor active layer and the source drain metal layer specifically include: forming the semiconductor active layer by using the patterning process for one time firstly, and then forming the source and drain metal layer including the source electrode, the drain electrode, the data line and the data line lead by using the patterning process for one time on the substrate on which the semiconductor active layer has been formed. In both patterning processes, an ordinary mask is used to expose. In this case, a pattern below the data line lead line and in the same layer as the semiconductor active layer may not be formed according to an actual condition.

Of course, the semiconductor active layer and the source drain metal layer including the source electrode and the drain electrode may also be formed by using the patterning process for one time according to a structure of the thin film transistor 20, and specifically, in one patterning process, a half-scale mask or a gray-scale mask can be used to expose, thus the semiconductor active layer and the source and drain metal layer including a source electrode, a drain electrode, a data line and a data lead line are formed.

S200, as shown in FIG. 5, an insulating layer 40, a common electrode 30, a passivation layer 50 and a pixel electrode 60 which are sequentially disposed on a side of the thin film transistor 20 away from the substrate 10 are formed by using the patterning process for three times, on the substrate 10 on which the thin film transistor 20 has been formed. The insulating layer 40 includes a first via hole 41. The common electrode 30 includes a third via hole 32 and a first hollowed-out portion 31. The passivation layer 50 includes a second via hole 51 and a second hollowed-out portion 52. An orthographic projection of the pixel electrode 60 on the substrate 10 dose not overlap with an orthographic projection of the first hollowed-out portion 31 on the substrate 10.

The active layer 21 of the thin film transistor 20 includes a source electrode region 211, a drain electrode region 212 and a channel region 213. The orthographic projection of the first hollowed-out portion 31 on the substrate 10 at least covers the channel region 213. The orthographic projection of the first hollowed-out portion 31 on the substrate 10 overlaps with an orthographic projection of the second hollowed-out portion 51 on the substrate 10. An orthographic projection of the first via hole 41 on the substrate 10, an orthographic projection of the second via hole 51 on the substrate 10 and an orthographic projection of the third via hole 32 on the substrate 10 are overlapped with each other. A size of the third via hole 32 is greater than or equal to a size of the first via hole 41, and the size of the third via hole 32 is greater than a size of the second via hole 51. The pixel electrode 60 is electrically connected to the drain electrode 23 of the thin film transistor 10 through the first via hole 41, the second via hole 51 and the third via hole 31.

The embodiments of the present disclosure provide a manufacturing method of the array substrate. The insulating layer 40, the common electrode layer 30 including the first hollowed-out portion 31, the passivation layer 50 and the pixel electrode 50 are sequentially formed on the side of the thin film transistor 20 away from the substrate 10 by using the patterning process for three times, thereby a number of the patterning process is reduced, a cost is saved, and a production efficiency is increased.

Figure 7:
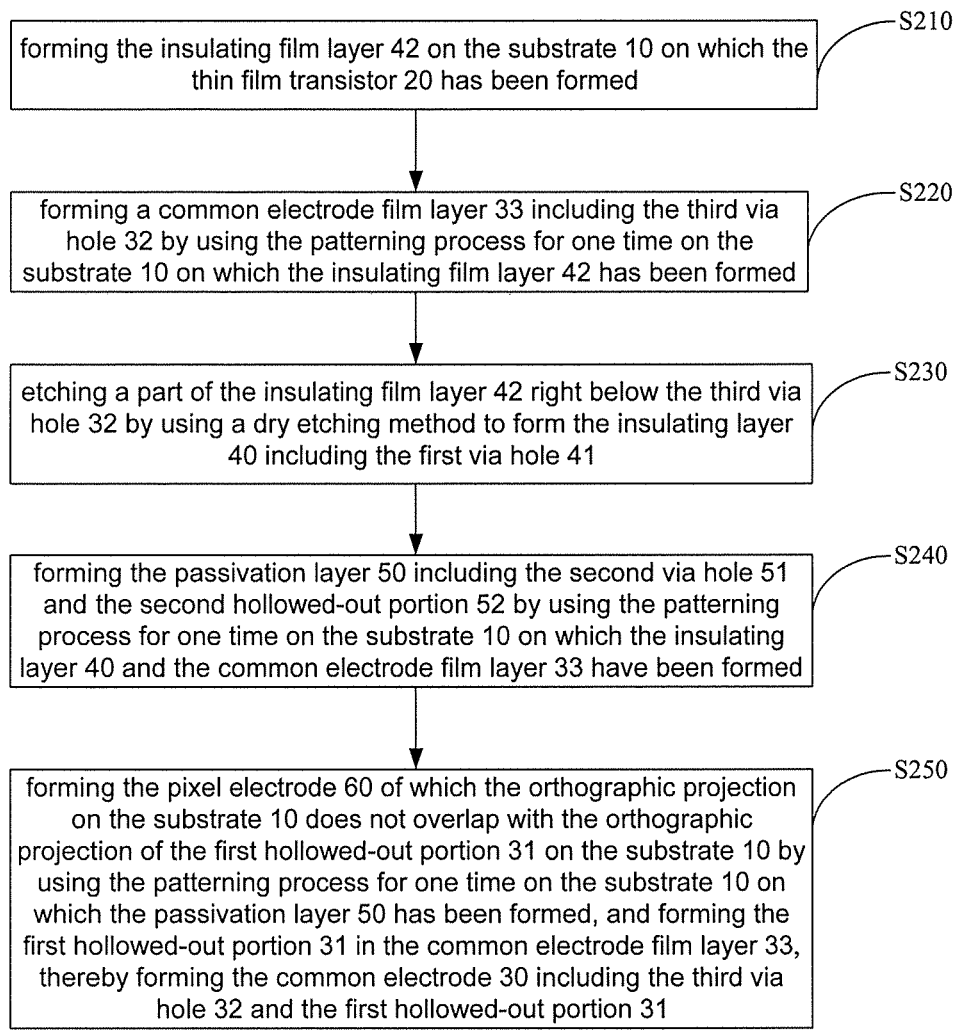
FIG. 7 is a second schematic flow chart of a manufacturing method of an array substrate provided in some embodiments of the present disclosure.

Optionally, as shown in FIG. 7, forming the insulating layer 40, the common electrode 30, the passivation layer 50 and the pixel electrode 60 which are sequentially disposed on the side of the thin film transistor 20 away from the substrate 10 by using the patterning process for three times specifically includes the following steps (S210~S250).

Figure 8A:
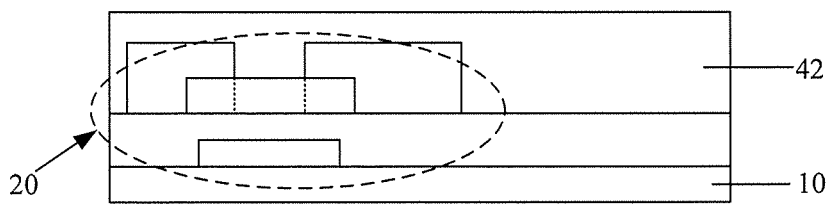
FIG. 8(a)-FIG. 8(e) are schematic diagrams of a process for manufacturing an array substrate provided in some embodiments of the present disclosure.

S210, as shown in FIG. 8(a), forming the insulating film layer 42 on the substrate 10 on which the thin film transistor 20 has been formed.

In this step, the thin film transistor 20 includes the gate, the gate insulating layer, the active layer, the source electrode and the drain electrode. The insulating film layer 42 is formed on the side of the thin film transistor 20 away from the substrate 10.

Figure 8B:
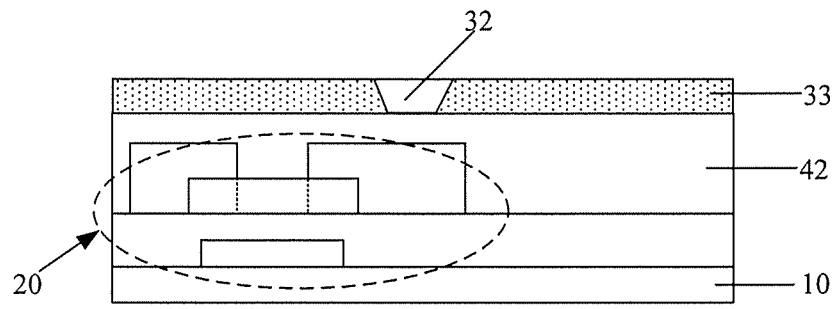

S220, as shown in FIG. 8(b), forming a common electrode film layer 33 including the third via hole 32 by using the patterning process for one time on the substrate 10 on which the insulating film layer 42 has been formed.

Figure 8C:
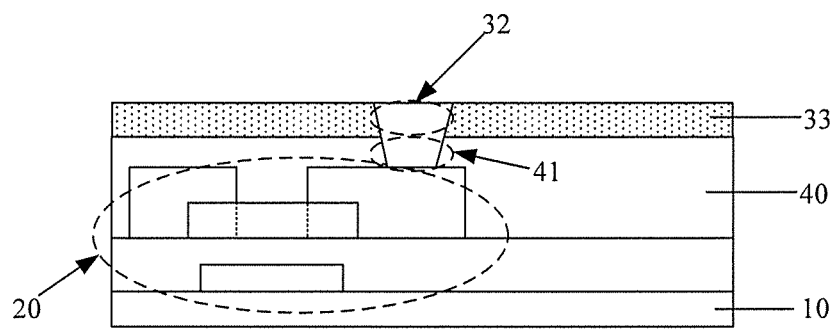

S230, as shown in FIG. 8(c), etching a part of the insulating film layer 42 located right below the third via hole 32 by using a dry etching method to form the insulating layer 40 including the first via hole 41.

At this time, the part of the insulating film layer 42 corresponding to the third via hole 32 is etched to form the first via hole 41 by using the common electrode film layer 33 including the third via hole 32 as a protection.

Figure 8D:
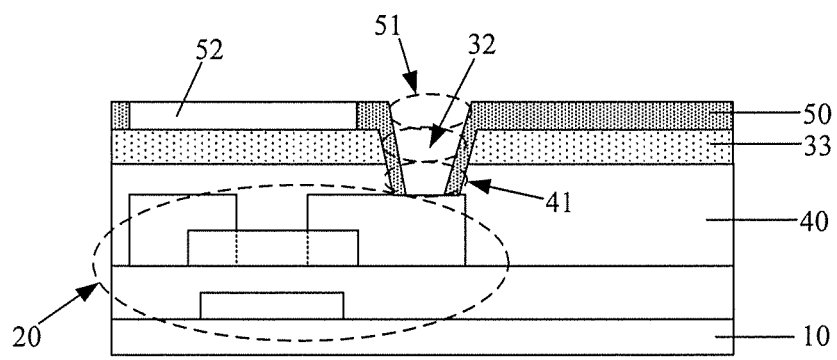

S240, as shown in FIG. 8(d), forming the passivation layer 50 including the second via hole 51 and the second hollowed-out portion 52 by using the patterning process for one time on the substrate 10 on which the insulating layer 40 and the common electrode film layer 33 have been formed.

Figure 8E:
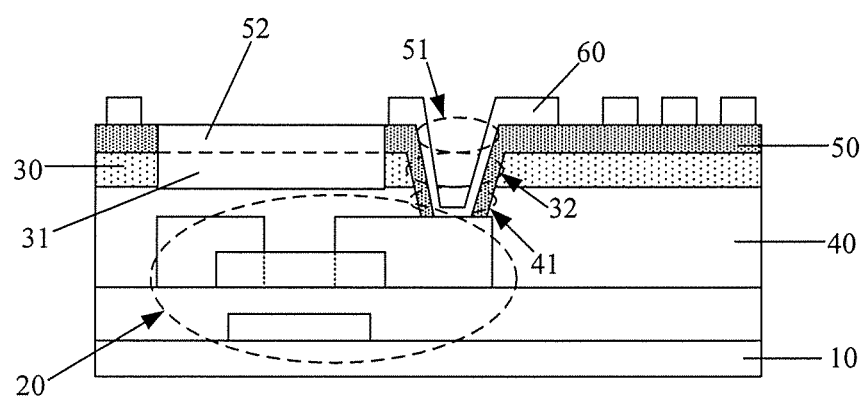

S250, as shown in FIG. 8(e), forming the pixel electrode 60 of which the orthographic projection on the substrate 10 does not overlap with the orthographic projection of the first hollowed-out portion 31 on the substrate 10 by using the patterning process for one time on the substrate 10 on which the passivation layer 50 has been formed, and forming the first hollowed-out portion 31 in the common electrode film layer 33, thereby forming the common electrode 30 including the third via hole 32 and the first hollowed-out portion 31.

At this time, after the pixel electrode 60 is patterned, the etching solution goes through the second hollowed-out portion 52 on the passivation layer 50 and continues to etch the common electrode film layer 33 to form the first hollowed-out portion 31. A pattern of the first hollowed-out portion 31 is the same as a pattern of the second hollowed-out portion 52. In this way, the common electrode 30 including the third via hole 32 and the first hollowed-out portion 31 is formed.

Specifically, forming the pixel electrode 60 of which the orthographic projection on the substrate 10 does not overlap with the orthographic projection of the first hollowed-out portion 31 on the substrate 10 by using the patterning process for one time on the substrate 10 on which the passivation layer 50 has been formed, and forming the first hollowed-out portion 31 in the common electrode film layer 33, thereby forming the common electrode 30 including the third via hole 32 and the first hollowed-out portion 31 specifically includes the following steps (S251~S254).

S251, forming a transparent conductive film on the substrate 10 on which the passivation layer 50 has been formed, and forming a photoresist.

S252, exposing the photoresist by using a mask, and developing to form a photoresist completely-remained portion and a photoresist completely-removed portion; wherein, the photoresist completely-removed portion at least corresponds to the first hollowed-out portion 31 which is to be formed, and a size of photoresist completely-removed portion corresponding to the first hollowed-out portion 31 which is to be formed is greater than a size of the first hollowed-out portion 31 which is to be formed.

S253, etching the transparent conductive film, and performing an over-etched process on the common electrode film layer 33 to form the pixel electrode 60 of which the orthographic projection on the substrate 10 does not overlap with the orthographic projection of the first hollowed-out portion 31 on the substrate 10, and to form the first hollowed-out portion 31 in the common electrode film layer 33, thereby the common electrode 30 including the third via hole 32 and the first hollowed-out portion 31 is formed.

S254, removing a part of the photoresist corresponding to the photoresist completely-remained portion by using a lift-off process.

Figure 9:
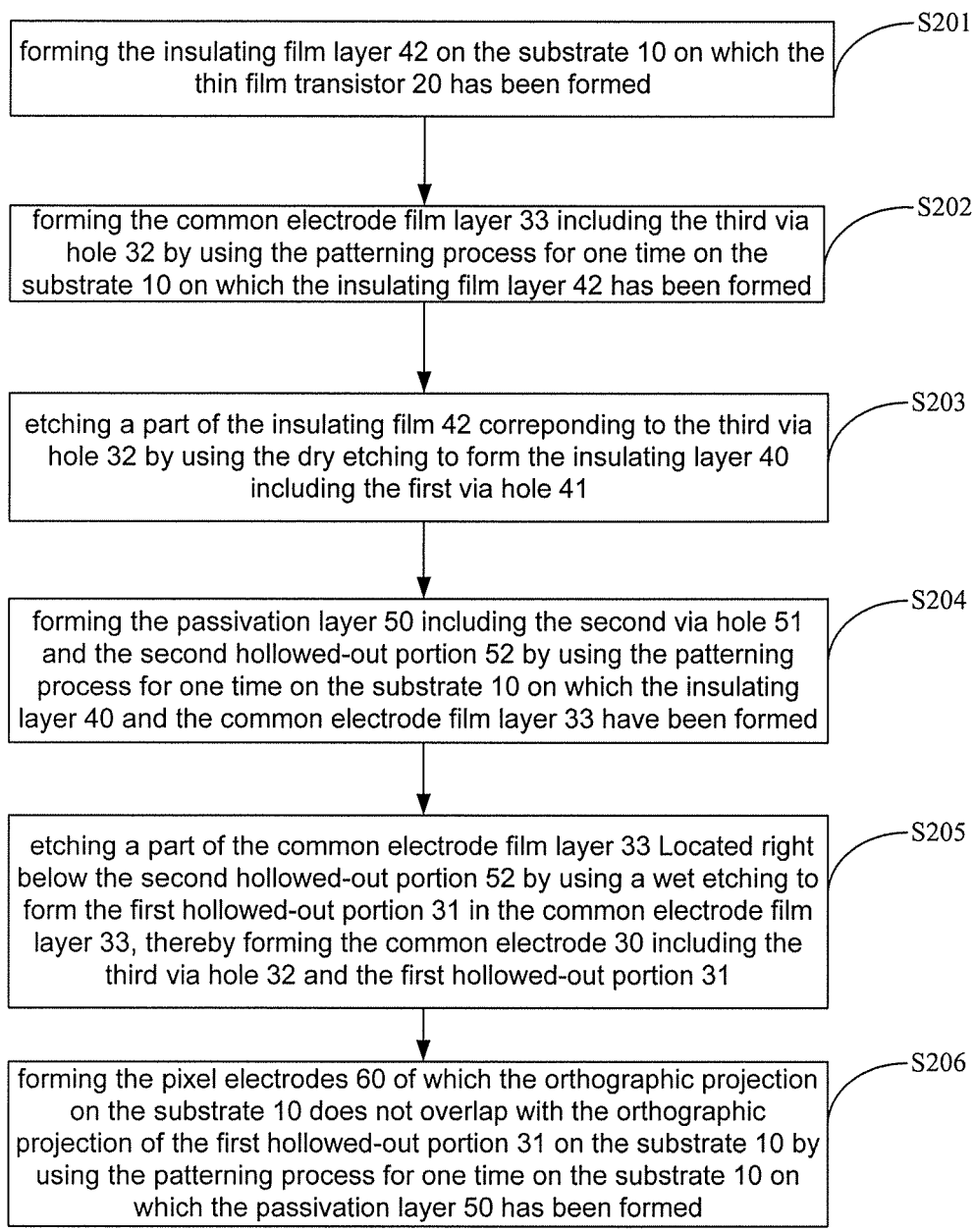
FIG. 9 is a third schematic flow chart of a manufacturing method for manufacturing an array substrate provided in some embodiments of the present disclosure.

Optionally, as shown in FIG. 9, forming the insulation layer 40, the common electrode 30, the passivation layer 50 and the pixel electrode 60 which are sequentially disposed on the side of the thin film transistor 20 away from the substrate 10 by using the patterning process for three times specifically includes the following steps (S201~S206).

S201, as shown in FIG. 8(a), forming the insulating film layer 42 on the substrate 10 on which the thin film transistor 20 has been formed.

S202, as shown in FIG. 8(b), forming the common electrode film layer 33 including the third via hole 32 by using the patterning process for one time on the substrate 10 on which the insulating film layer 42 has been formed.

S203, as shown in FIG. 8(c), etching a part of the insulating film 42 located right below the third via hole 32 by using the dry etching to form the insulating layer 40 including the first via hole 41.

S204, as shown in FIG. 8(d), forming the passivation layer 50 including the second via hole 51 and the second hollowed-out portion 52 by using the patterning process for one time on the substrate 10 on which the insulating layer 40 and the common electrode film layer 33 have been formed.

Figure 10:
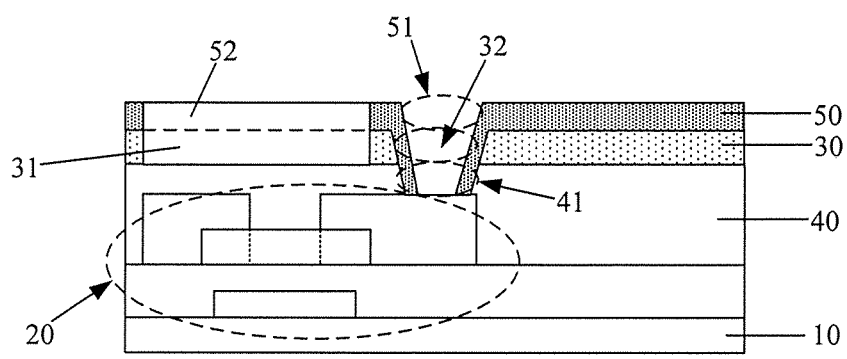
FIG. 10 is a fifth structural schematic diagram of an array substrate provided in some embodiments of the present disclosure.

S205, as shown in FIG. 10, etching a part of the common electrode film layer 33 located right below the second hollowed-out portion 52 by using a wet etching to form the first hollowed-out portion 31 on the common electrode film layer 33, thereby forming the common electrode 30 including the third via hole 32 and the first hollowed-out portion 31.

In this step, a material of the common electrode 30 is a transparent conductive material, a material of the drain electrode of the thin film transistor is a metal conductive material, and materials of the common electrode 30 and the thin film transistor are different, so the drain electrode is not affected when the common electrode film layer 33 is etched.

S206, as shown in FIG. 8(e), forming the pixel electrodes 60 of which the orthographic projection on the substrate 10 does not overlap with the orthographic projection of the first hollowed-out portion 31 on the substrate 10 by using the patterning process for one time on the substrate 10 on which the passivation layer 50 has been formed.

Based on the above, optionally, forming the thin film transistor 20 on the substrate 10 by using the patterning process specifically includes the following contents.

A gate metal layer including a gate is formed on the substrate 10 by using the patterning process for one time, and thereby a gate passivation layer is formed.

An active layer and a source drain metal layer including the source electrode and the drain electrode are formed by using the patterning process for one time on the substrate 10 on which the gate passivation layer has been formed by using the patterning process for one time.

The foregoing descriptions are merely specific embodiments of the present disclosure, but the protection scope of the present disclosure is not limited thereto, changes and substitutions that anyone skilled in the art may easily conceive within the technical scope disclosed in the present disclosure should be covered by the scope of the present disclosure. Therefore, the protection scope of the present disclosure should be based on the protection scope of the claims.

The present disclosure may further provide additional embodiments, which may include any one of the above embodiments and one or more of the components, functions, or structures in the additional embodiments may be replaced or supplemented by one or more of the components, functions or structures in the above embodiments.

What is claimed is:

1. An array substrate, comprising a substrate, a thin film transistor disposed on the substrate, and a common electrode including a first hollowed-out portion and disposed on a side of the thin film transistor away from the substrate,
   wherein, the thin film transistor comprises an active layer, the active layer comprising a source electrode region, a drain electrode region and a channel region, and an orthographic projection of the first hollowed-out portion on the substrate completely covers orthographic projections of the active layer and a source electrode on the substrate.

2. The array substrate according to claim 1, wherein, the array substrate further comprises an insulating layer disposed between the thin film transistor and the common electrode, and a passivation layer and a pixel electrode which are sequentially disposed on a side of the common electrode away from the substrate, wherein, the insulating layer comprises a first via hole, the passivation layer comprises a second via hole and a second hollowed-out portion, and an orthographic projection of the pixel electrode on the substrate does not overlap with the orthographic projection of the first hollowed-out portion on the substrate,
   the common electrode further comprises a third via hole;
   the orthographic projection of the first hollowed-out portion on the substrate overlaps with an orthographic projection of the second hollowed-out portion on the substrate; an orthographic projection of the first via hole on the substrate, an orthographic projection of the second via hole on the substrate and an orthographic projection of the third via hole on the substrate are overlapped with each other, a size of the third via hole is greater than or equal to a size of the first via hole, and the size of the third via hole is greater than a size of the second via hole; and
   the pixel electrode is electrically connected to a drain electrode of the thin film transistor through the first via hole, the second via hole and the third via hole.

3. A display panel, comprising an array substrate, wherein, the array substrate comprises a substrate, a thin film transistor disposed on the substrate, and a common electrode including a first hollowed-out portion and disposed on a side of the thin film transistor away from the substrate,
   the thin film transistor comprises an active layer, the active layer comprises a source electrode region, a drain electrode region and a channel region, and an orthographic projection of the first hollowed-out portion on the substrate completely covers orthographic projections of the active layer and a source electrode on the substrate.

4. The display panel according to claim 3, wherein, the array substrate further comprises an insulating layer disposed between the thin film transistor and the common electrode, and a passivation layer and a pixel electrode which are sequentially disposed on a side of the common electrode away from the substrate, wherein, the insulating layer comprises a first via hole, the passivation layer comprises a second via hole and a second hollowed-out portion, and an orthographic projection of the pixel electrode on the substrate does not overlap with the orthographic projection of the first hollowed-out portion on the substrate,
   the common electrode further comprises a third via hole;
   the orthographic projection of the first hollowed-out portion on the substrate overlaps with an orthographic projection of the second hollowed-out portion on the substrate; an orthographic projection of the first via hole on the substrate, an orthographic projection of the second via hole on the substrate and an orthographic projection of the third via hole on the substrate are overlapped with each other, a size of the third via hole is greater than or equal to a size of the first via hole, and the size of the third via hole is greater than a size of the second via hole; and
   the pixel electrode is electrically connected to a drain electrode of the thin film transistor through the first via hole, the second via hole and the third via hole.

5. A manufacturing method of the array substrate according to claim 1, comprising:
   forming the thin film transistor on the substrate;
   forming an insulating layer, the common electrode, a passivation layer and a pixel electrode which are sequentially disposed on a side of the thin film transistor away from the substrate, on the substrate on which the thin film transistor has been formed;
   wherein, the insulating layer comprises a first via hole, the common electrode comprises a third via hole and the first hollowed-out portion, the passivation layer comprises a second via hole and a second hollowed-out part, and an orthographic projection of the pixel electrode on the substrate does not overlap with an orthographic projection of the first hollowed-out portion on the substrate;
   wherein, the orthographic projection of the first hollowed-out portion on the substrate completely covers orthographic projections of the active layer and a source electrode on the substrate, the orthographic projection of the first hollowed-out portion on the substrate overlaps with an orthographic projection of the second hollowed-out portion on the substrate;

wherein, an orthographic projection of the first via hole on the substrate, an orthographic projection of the second via hole on the substrate and an orthographic projection of the third via hole on the substrate are overlapped with each other, a size of the third via hole is greater than or equal to a size of the first via hole, and the size of the third via hole is greater than a size of the second via hole; and wherein, the pixel electrode is electrically connected to a drain electrode of the thin film transistor through the first via hole, the second via hole and the third via hole.

6. The manufacturing method according to claim 5, wherein, the forming the insulating layer, the common electrode, the passivation layer and the pixel electrode which are sequentially on the side of the thin film transistor away from the substrate comprises:

forming an insulating film layer on the substrate on which the thin film transistor has been formed;

forming a common electrode film layer comprising the third via hole by using a first patterning process on the substrate on which the insulating film layer has been formed;

etching a part of the insulating film layer located right below the third via hole by using a dry etching to form the insulating layer comprising the first via hole;

forming the passivation layer comprising the second via hole and the second hollowed-out portion by using a second patterning process on the substrate on which the insulating layer and the common electrode film layer have been formed;

forming the pixel electrode on the substrate on which the passivation layer has been formed and the common electrode further comprising the first hollowed-out portion from the common electrode film layer with the third via hole by using a third patterning process, wherein, the orthographic projection of the pixel electrode on substrate does not overlap with the orthographic projection of the first hollowed-out portion on the substrate.

7. The manufacturing method according to claim 6, wherein, forming the pixel electrode on the substrate on which the passivation layer has been formed and the common electrode further comprising the first hollowed-out portion from the common electrode film layer with the third via hole by using the third patterning process comprises:

forming a transparent conductive film on the substrate on which the passivation layer has been formed, and forming a photoresist;

exposing the photoresist by using a mask, and developing to form a photoresist completely-remained portion and a photoresist completely-removed portion, wherein, the photoresist completely-removed portion at least corresponds to a position where the first hollowed-out portion which is to be formed, and a size of the photoresist completely-removed portion corresponding to the first hollowed-out portion which is to be formed is greater than a size of the first hollowed-out portion which is to be formed;

etching the transparent conductive film and the common electrode film layer with the third via hole, so as to form the pixel electrode on the substrate on which the passivation layer has been formed and the common electrode film layer further comprising the first hollowed-out portion from the common electrode film layer with the third via hole; and removing a part of the photoresist corresponding to the photoresist completely-remained portion by using a lift-off process.

8. The manufacturing method according to claim 5, wherein, forming the insulating layer, the common electrode, the passivation layer and the pixel electrode which are sequentially disposed on the side of the thin film transistor away from the substrate comprises:

forming an insulating film layer on the substrate on which the thin film transistor has been formed;

forming a common electrode film layer comprising the third via hole by using the first patterning process on the substrate on which the insulating film layer has been formed;

etching a part of the insulating film layer located right below the third via hole by using a dry etching to form the insulating layer comprising the first via hole;

forming the passivation layer comprising the second via hole and the second hollowed-out portion by using the second patterning process on the substrate on which the insulating layer and the common electrode film layer have been formed;

etching a part of the common electrode film layer located right below the second hollowed-out portion by using a wet etching to form the first hollowed-out portion in the common electrode film layer, thereby forming the common electrode comprising the third via hole and the first hollowed-out portion; and forming the pixel electrode on the substrate on which the passivation layer has been formed by using a fourth patterning process, wherein the orthographic projection of the pixel electrode on the substrate does not overlap with the orthographic projection of the first hollowed-out portion on the substrate.

9. The manufacturing method according to claim 6, wherein, forming a common electrode film layer comprising the third via hole by using the first patterning process on the substrate on which the insulating film layer has been formed comprises:

forming a common electrode film layer on the substrate on which the insulating film layer has been formed, and forming a photoresist;

exposing the photoresist by using a mask, and developing the photoresist to form a photoresist completely-remained portion and a photoresist completely-removed portion, wherein the photoresist completely-removed portion at least corresponds to a position where the third via hole which is to be formed;

etching the common electrode film layer to form the common electrode film layer comprising the third via hole;

removing a part of the photoresist corresponding to the photoresist completely-remained portion by using a lift-off process.

10. The manufacturing method according to claim 6, wherein, forming the passivation layer comprising the second via hole and the second hollowed-out portion by using the second patterning process on the substrate on which the insulating layer and the common electrode film layer have been formed comprises:

forming a passivation film layer on the substrate on which the insulating layer and the common electrode film layer has been formed, and forming a photoresist;

exposing the photoresist by using a mask, and developing the photoresist to form a photoresist completely-remained portion and a photoresist completely-removed portion, wherein, the photoresist completely-removed portion at least corresponds to positions where the second via hole and the second hollowed-out portion which are to be formed;

etching the passivation film layer to form the passivation layer comprising the second via hole and the second hollowed-out portion;

removing a part of the photoresist corresponding to the photoresist completely-remained portion by using a lift-off process.

11. The manufacturing method according to claim 8, wherein, forming a common electrode film layer comprising the third via hole by using the first patterning process on the substrate on which the insulating film layer has been formed comprises:

forming a common electrode film layer on the substrate on which the insulating film layer has been formed, and forming a photoresist;

exposing the photoresist by using a mask, and developing the photoresist to form a photoresist completely-remained portion and a photoresist completely-removed portion, wherein the photoresist completely-removed portion at least corresponds to a position where the third via hole which is to be formed;

etching the common electrode film layer to form the common electrode film layer comprising the third via hole;

removing a part of the photoresist corresponding to the photoresist completely-remained portion by using a lift-off process.

12. The manufacturing method according to claim 8, wherein, forming the passivation layer comprising the second via hole and the second hollowed-out portion by using the second patterning process on the substrate on which the insulating layer and the common electrode film layer have been formed comprises:

forming a passivation film layer on the substrate on which the insulating layer and the common electrode film layer has been formed, and forming a photoresist;

exposing the photoresist by using a mask, and developing the photoresist to form a photoresist completely-remained portion and a photoresist completely-removed portion, wherein, the photoresist completely-removed portion at least corresponds to positions where the second via hole and the second hollowed-out portion which are to be formed;

etching the passivation film layer to form the passivation layer comprising the second via hole and the second hollowed-out portion;

removing a part of the photoresist corresponding to the photoresist completely-remained portion by using a lift-off process.

13. The manufacturing method according to claim 8, wherein, forming the pixel electrode on the substrate on which the passivation layer has been formed by using the fourth patterning process comprises:

forming a transparent conductive film on the substrate on which the passivation layer has been formed, and forming a photoresist;

exposing the photoresist by using a mask, and developing the photoresist to form a photoresist completely-remained portion and a photoresist completely-removed portion;

etching the transparent conductive film to form the pixel electrode, wherein the orthographic projection of the pixel electrode on substrate does not overlap with the orthographic projection of the first hollowed-out portion on the substrate; and removing a part of the photoresist corresponding to the photoresist completely-remained portion by using a lift-off process.

* * * * *